(12) United States Patent
Lin

(10) Patent No.: US 8,710,879 B2
(45) Date of Patent: Apr. 29, 2014

(54) APPARATUS AND METHOD FOR MULTIPLYING FREQUENCY OF A CLOCK SIGNAL

(75) Inventor: Song Sheng Lin, Hsinchu (TW)

(73) Assignee: Silicon Integrated System Corp., Hsinchu (TW)

( * ) Notice: Subject to any disclaimer, the term of this patent is extended or adjusted under 35 U.S.C. 154(b) by 0 days.

(21) Appl. No.: 13/543,350

(22) Filed: Jul. 6, 2012

(65) Prior Publication Data

US 2014/0009193 A1    Jan. 9, 2014

(51) Int. Cl.
*H03K 21/00* (2006.01)
*H03K 23/00* (2006.01)
*H03K 25/00* (2006.01)

(52) U.S. Cl.
USPC ............................ 327/115; 327/113; 327/116

(58) Field of Classification Search
USPC .......................................... 327/113, 115, 116
See application file for complete search history.

(56) References Cited

U.S. PATENT DOCUMENTS

| 2003/0058009 A1* | 3/2003 | Fallahi et al. | 327/115 |
| 2004/0046594 A1* | 3/2004 | Konuk et al. | 327/116 |
| 2011/0304366 A1* | 12/2011 | Kanda et al. | 327/157 |

* cited by examiner

*Primary Examiner* — John Poos
(74) *Attorney, Agent, or Firm* — Muncy, Geissler, Olds & Lowe, P.C.

(57) ABSTRACT

An apparatus and method for multiplying frequency of a clock signal are provided, wherein the apparatus provides an initial oscillator signal, compares the initial oscillator signal with a reference signal to generate a first control signal, selectively outputs one of at least one lower threshold value and at least one upper threshold value from a threshold value generation circuit to a clock output circuit according to at least the first control signal, and updates an output clock signal through a digital and logical module processing the comparison of the initial oscillator signal and the selected one of the at least one upper and lower threshold values and the comparison of the initial oscillator signal and a low level signal.

20 Claims, 11 Drawing Sheets

| SE1 | CA4 | NR |
|---|---|---|
| 0 | 0 | 0 |
| 0 | 1 | 1 |

| SE1 | CA3 | NR |
|---|---|---|
| 1 | 0 | 0 |
| 1 | 1 | 1 |

| SE1 | NR | RS |
|---|---|---|
| 0 | 0 | 0 |
| 0 | 1 | 1 |
| 1 | 0 | 2 |
| 1 | 1 | 3 |

APPARATUS AND METHOD FOR MULTIPLYING FREQUENCY OF A CLOCK SIGNAL

BACKGROUND

1. Technical Field

The disclosure relates to a frequency multiplier, and more particularly to an apparatus and a method for multiplying frequency of a clock signal by automatic calibration.

2. Related Art

Over the years, various problems occur as microprocessors become higher in integration and performance. First, the volume increase of the System-on-Chip (SoC) is caused by the increase in clock skew and clock frequency. As a result, the period of one cycle is shortened, thereby increasing the burden of jitter. Second, higher integration requires higher power density, so there is also a need to take a low-power design into consideration.

Therefore, an apparatus which can generate high frequency clock based on multiply frequency method while keeping the low-jitter and low power consumption is in demand.

SUMMARY

The disclosure discloses an apparatus and a method for multiplying frequency of a clock signal. The apparatus includes an oscillation circuit, a control signal generation circuit, a threshold value generation circuit and a clock output circuit. The oscillation circuit generates an initial oscillator signal. The control signal generation circuit compares the initial oscillator signal with a reference signal to generate a first control signal. The threshold value generation circuit receives the initial oscillator signal and outputs each of at least one upper threshold value and at least one lower threshold value by turns according to at least the first control signal. The clock output circuit comprises a digital and logical module outputting an output clock signal by processing the comparison between the initial oscillator signal and the outputted one of the at least one upper and lower threshold values and the comparison between the initial oscillator signal and the low level signal.

Firstly, an initial oscillator signal is provided and compared with a reference signal to generate a first control signal. One of at least one lower threshold value and at least one upper threshold value is selectively transmitted from a threshold value generation circuit according to at least the first control signal. An output clock signal is outputted by processing the comparison of the initial oscillator signal and the selected one of the at least one upper and lower threshold values and the comparison of the initial oscillator signal and a low level signal, through a digital and logical module.

For purposes of summarizing, some aspects, advantages and features of some embodiments of the disclosure have been described in this summary. Not necessarily all of (or any of) these summarized aspects, advantages or features will be embodied in any particular embodiment of the disclosure. Some of these summarized aspects, advantages and features and other aspects, advantages and features may become more fully apparent from the following detailed description and the appended claims.

BRIEF DESCRIPTION OF THE DRAWINGS

The disclosure will become more fully understood from the detailed description given herein below for illustration only, and thus are not limitative of the disclosure, and wherein.

DETAILED DESCRIPTION

The detailed features and advantages of the disclosure are described below in great detail through the following embodiments, the content of which is sufficient for those of ordinary skill in the art to understand the technical content of the disclosure and to implement the disclosure accordingly. Based upon the content of the specification, the claims, and the drawings, those of ordinary skill in the art can easily understand the relevant objectives and advantages of the disclosure.

Figure 1:
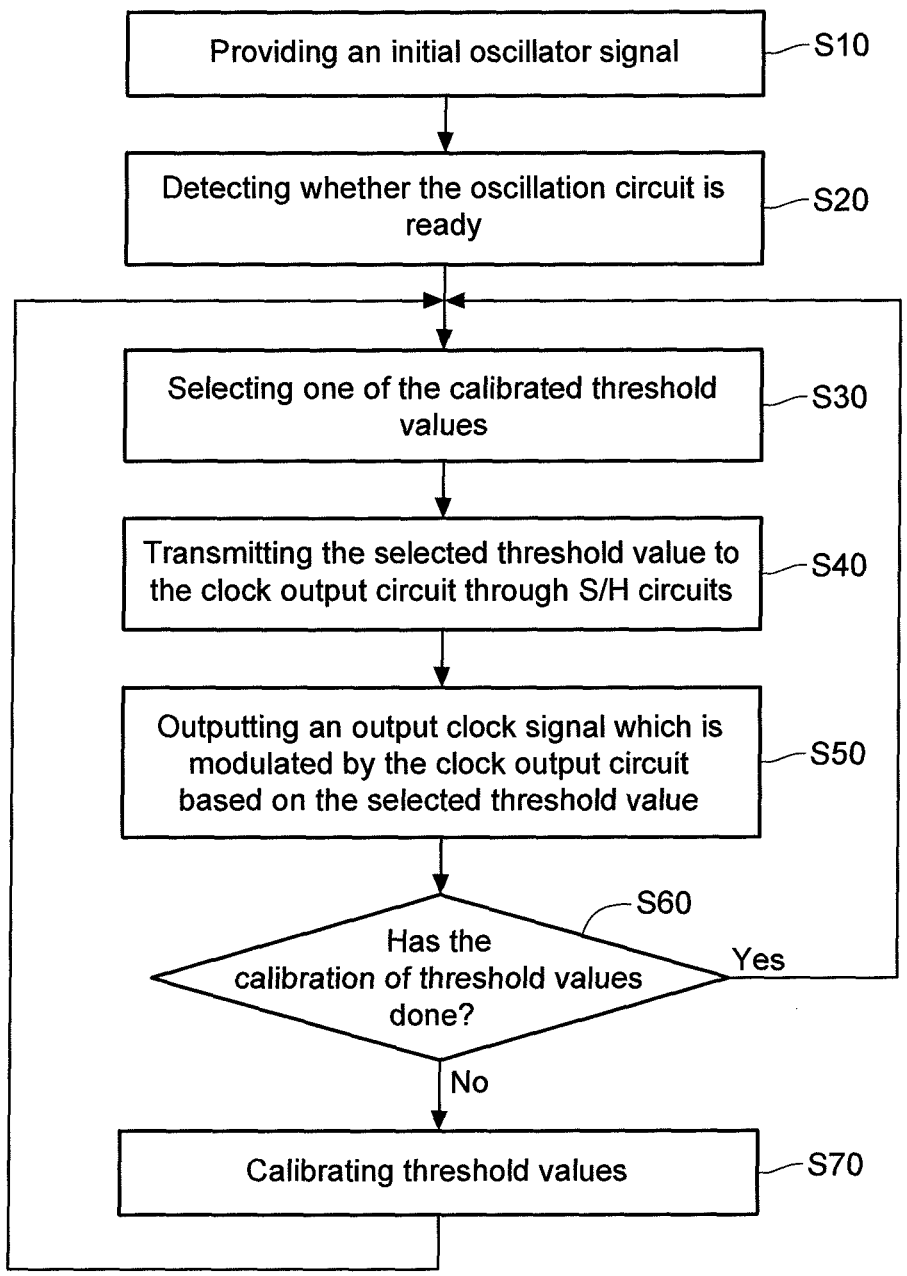
FIG. 1 is a flow chart of one embodiment of a method of multiplying the frequency of a clock signal of the disclosure.

Referring to FIG. 1, a flow chart of a method for multiplying frequency of a clock signal is shown. Initially, an oscillator signal is provided (step S10). After the oscillator is ready (step S20), one of voltage levels (threshold values) is selected (step S30) and the selected threshold value is transmitted to the clock output circuit through corresponding one of S/H circuits (step S40). The output clock signal is modulated by comparing the initial oscillator signal with different selected threshold values (step S50). During the output clock signal is toggling (step S60), the threshold values are calibrated under a calibration procedure to update the output clock signal (step S70), but it is not necessary to perform the calibration procedure when the output clock signal has toggled (step S60) at the desired duty cycle or pulse width. After the output clock signal has toggled, the system of the disclosure may enter normal operation, that is, the system may directly utilize the calibrated threshold values to output the output clock signal (steps S30-S50).

Through the above process, the frequency of the output clock signal can be multiplied in the order of 2 of the frequency of the initial oscillator signal with desired duty cycle or pulse width. The toggled output clock signal indicates the frequency of the output clock signal has become the desire frequency of the initial oscillator signal through the above the process.

Figure 2:
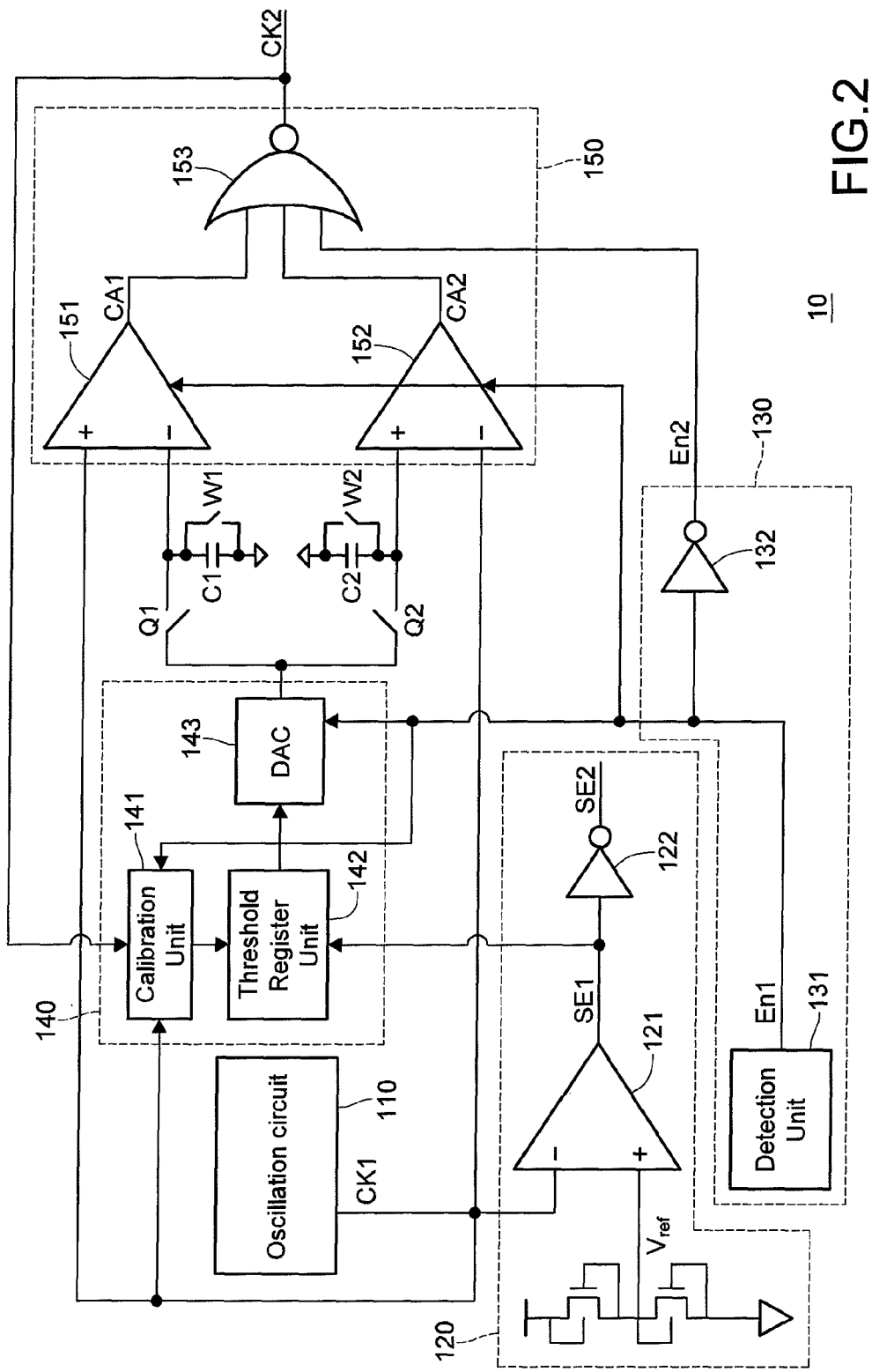
FIG. 2 is a block diagram of an apparatus for doubling the frequency of a clock signal in the implementation of FIG. 1.

FIG. 2 illustrates a block diagram of an apparatus for doubling the frequency of a clock signal according to an embodiment of FIG. 1. The apparatus 10 includes an oscillation circuit 110, a control signal generation circuit 120, a detection circuit 130, a threshold value generation circuit 140 and a clock output circuit 150. The detailed structures of the elements of the apparatus 10 are disclosed as below.

The oscillation circuit 110 generates an initial oscillator signal CK1 to the apparatus 10 and may be but not limit to a crystal oscillator, a voltage-controlled oscillator (VCO), or other oscillators. The control signal generation circuit 120 includes a control comparator 121 which includes a positive end and a negative end, and an inverter 122. The positive end of the control comparator 121 receives a reference signal Vref, and the negative end of the control comparator 121 connects to the oscillation circuit 110 to receive the initial oscillator signal CK1. The control comparator 121 compares the initial oscillator signal CK1 with the reference signal Vref and then outputs a first control signal SE1. The inverter 122 connects to an output end of the control comparator 121 to receive and invert the first control signal SE1 and outputs a second control signal SE2. The reference signal Vref may be but not limit to a half of Vdd, and Vdd is a system voltage of the apparatus 10.

The threshold value generation circuit 140 includes a calibration unit 141, a threshold register unit 142 and a digital to analog converter 143. The calibration unit 141 connects to the oscillation circuit 110 and the clock output circuit 150 to calibrate the target duty cycle or pulse width of an output clock signal CK2. The threshold register unit 142 connects to the calibration unit 141 to preserve the calibrated threshold values which may include but not limit to at least one upper threshold value and at least one lower threshold value, and then asynchronously outputs one of the preserved threshold values to the digital to analog converter 143 according to the first control signal SE1 in this embodiment. The digital to analog converter 143 transforms the selected threshold value from digital type to analog type and then outputs the transformed threshold value to the clock output circuit 150. In another embodiment, the threshold register 142 may be replaced by a memory unit or other storage devices.

In other embodiment, the calibration unit 141 may selectively calibrate one of the threshold values according to the first control signal and directly transmit the calibrated threshold value to the digital to analog converter 143 without preserving the calibrated threshold value to the threshold register unit 142.

The clock output circuit 150 includes a first comparator 151, a second comparator 152 and a first NOR gate 153 (a digital and logical module). In one embodiment, a positive end of the first comparator 151 connects to the oscillation circuit 110 to receive the initial oscillator signal CK1, and the negative end of the first comparator 151 receives an upper threshold value through the first sample and hold (hereinafter "S/H") circuit. A negative end of the second comparator 152 connects to the oscillation circuit 110 to receive the initial oscillator signal CK1, and the positive end of the second comparator 152 receives a lower threshold value through the second S/H circuit. The first and second S/H circuits are described more detail later.

The first comparator 151 compares the initial oscillator signal CK1 with the upper threshold value to output a first logic signal CA1. The second comparator 152 compares the initial oscillator signal CK1 with the lower threshold value to output a second logic signal CA2. Sequentially, the first NOR gate connects to the output ends of the first comparator 151 and second comparator 152 to processes the first logic signal CA1 and the second logic signal CA2 and outputs the output clock signal CK2. The detailed description of the clock output circuit 150 is disclosed in FIG. 3.

The detection circuit 130 includes a detection unit 131 and an inverter 132. The detection unit 131 detects whether the oscillation circuit 110 is ready, that is for example and without limitation, to check whether the peak value of the initial oscillator signal CK1 approaches a detection threshold by using a peak detector deposed in the detection circuit 130. The detection circuit 130 outputs an enable signal En1 which is at a high level when the oscillation circuit 110 is ready, and vice versa. The inverter 132 connects to the detection circuit 130 to invert the enable signal En1 and outputs an inverse enable signal En2.

The first S/H circuit includes a switch Q1 and a first charging circuit. The switch Q1 is disposed between the digital to analog converter 143 and the negative end of the first comparator 151 and is controlled by the second control signal SE2. The first charging circuit includes a capacitor C1 and a switch W1. The switch W1 is disposed between the negative end of the first comparator 151 and the ground and is controlled by a reset signal of the apparatus 10. The capacitor C1 is disposed between the negative end of the first comparator 151 and the ground.

The second S/H circuit includes a switch Q2 and a second charging circuit. The switch Q2 is disposed between the digital to analog converter 143 and the positive end of the second comparator 152 and is controlled by the first control signal SE1. The second charging circuit includes a capacitor C2 and a switch W2. The switch W2 is disposed between the positive end of the second comparator 152 and the ground and is controlled by the reset signal. The capacitor C2 is disposed between the positive end of the second comparator 152 and the ground. The detailed operation of the apparatus 10 is disclosed as below.

Figure 3:
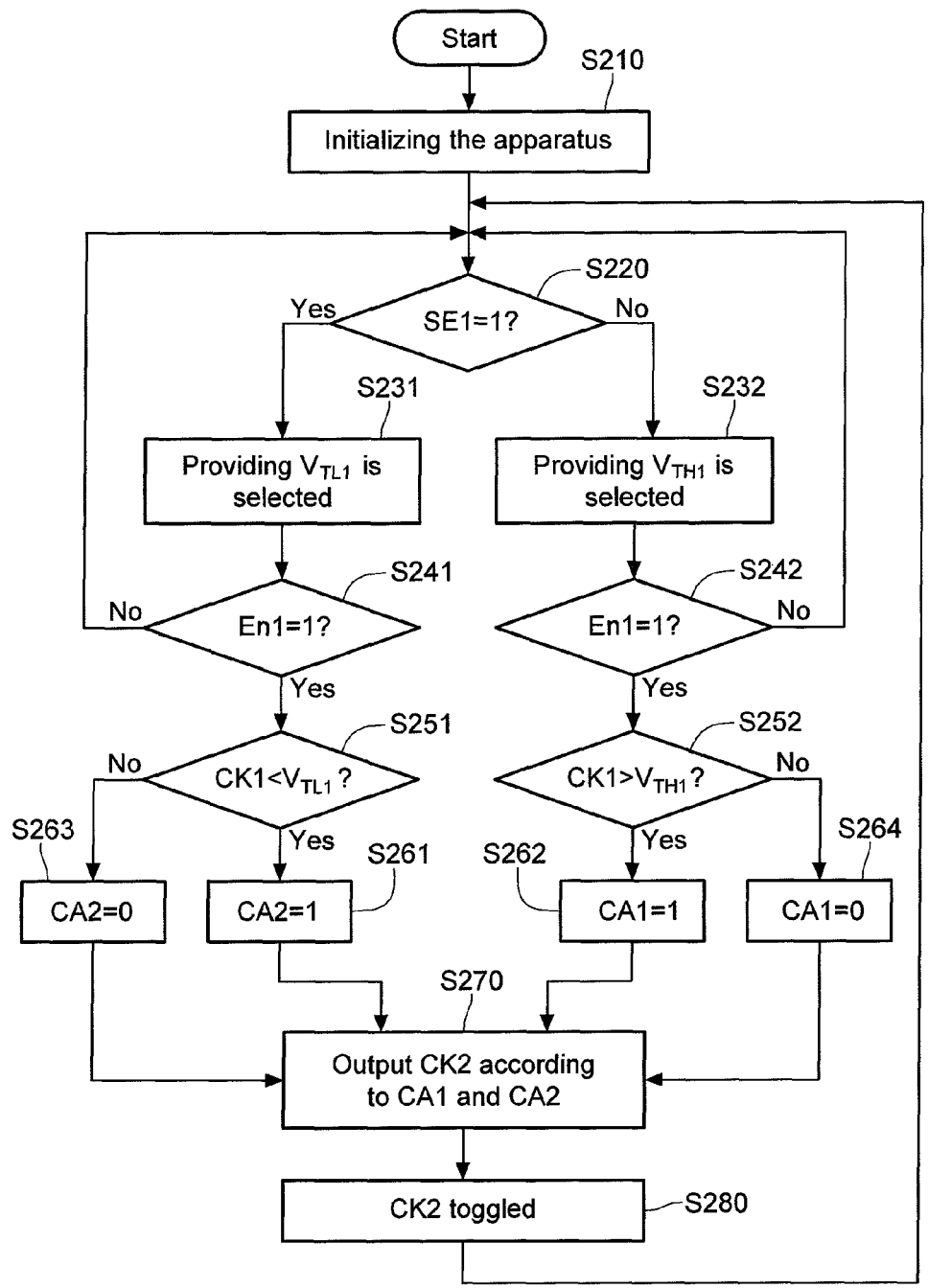
FIG. 3 is a flow chart of a method of doubling the frequency of a clock signal in the implementation of FIG. 2.
Figure 5:
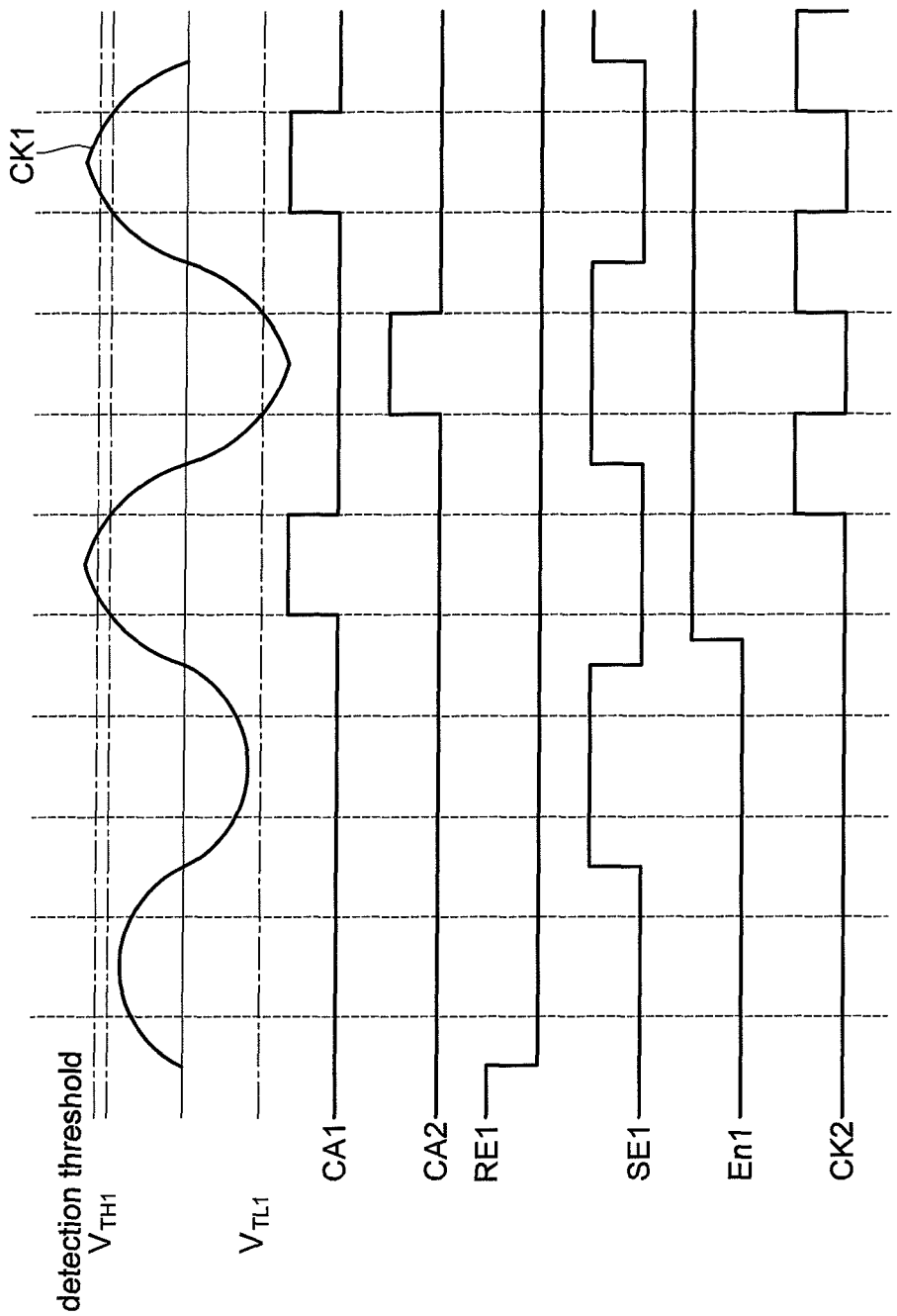
FIG. 5 is a sequence diagram of the implementation of FIG. 2.

As shown in FIG. 3 and FIG. 5, FIG. 3 illustrates a flow chart of doubling the frequency of a clock signal in the implementation of FIG. 2, and FIG. 5 illustrates a sequence diagram of the implementation of FIG. 2. Firstly, the apparatus 10 is initialized when the apparatus 10 starts operating (step S210). The apparatus 10 provides a reset signal RE to the switches W1 and W2 to control the switches W1 and W2 closed, and the energy stored in the capacitors C1 and C2 are reset.

Subsequently, the first control signal SE1 is determined (step S220). When the initial oscillator signal CK1 is larger than the reference signal Vref, the first control signal SE1 is at a low level (hereinafter "0"), the second control signal SE2 is at a high level (hereinafter "1"), and the upper threshold value $V_{TH1}$ is selected (step S232).

Further, the operation of the Oscillation circuit 110 is determined by the detection unit 131 (step 242). When the oscillation circuit 110 is not ready, the enable signal En1 is 0, and the process is back to the step S220. When the oscillation circuit 110 is ready, the enable signal En1 is 1, the threshold value generation circuit 140 and the first and second comparators 151 and 152 are enabled. The threshold value generation circuit 140 transmits the upper threshold value $V_{TH1}$ to the first comparator 151 through a first S/H provided by the switch Q1 turned ON according to the second control signal SE2, and the upper threshold value $V_{TH1}$ charges the capacitor C1 to be maintained at the negative end of the first comparator 151.

The first comparator 151 further compares the initial oscillator signal CK1 with the upper threshold value $V_{TH1}$ (step S252). When the initial oscillator signal CK1 is greater than the upper threshold value $V_{TH1}$, the first logic signal CA1 of the output end of the first comparator 151 is 1 (step S262). The second logic signal CA2 of the output end of the second comparator 152 is 0 because of no input at the positive end (hereinafter a low level signal of "0"). The first NOR gate 153 receives the first logic signal CA1 and the second logic signal CA2 and outputs the output clock signal CK2 which is 0 (step S270).

However, when the initial oscillator signal CK1 is less than the upper threshold value $V_{TH1}$, the first logic signal CA1 becomes 0 (step S264). The first NOR gate 153 receives the first logic signal CA1 and the second logic signal CA2 which is 0 because of no input at the positive end, and outputs the output clock signal CK2 which becomes 1 (step S270).

On the other hand, in the step S220, when the initial oscillator signal CK1 is less than the reference signal Vref, the first control signal SE1 becomes 1, the second control signal SE2 becomes 0, and the lower threshold value $V_{TL1}$ is selected (step S231).

Subsequently, the operation of the oscillation circuit 110 is determined by the detection unit 131 (step 241). When the oscillation circuit 110 is not ready, the enable signal En1 is 0, and the process is back to the step S220. When the oscillation circuit 110 is ready, the enable signal En1 is 1, the threshold value generation circuit 140 and the first and second comparators 151 and 152 are enabled. The threshold value generation circuit 140 transmits the lower threshold value $V_{TL1}$ to the second comparator 152 through a second S/H provided by the switch Q2 turned ON according to the first control signal SE1, and the lower threshold value $V_{TH1}$ charges the capacitor C2 to be maintained at the positive end of the second comparator 152.

The second comparator 152 further compares the initial oscillator signal CK1 with the lower threshold value $V_{TH1}$ (step S251). When the initial oscillator signal CK1 is less than the lower threshold value $V_{TL1}$, the second logic signal CA2 of the output end of the second comparator 152 is 1 (step S261). The first NOR gate 153 receives the second logic signal CA2 and the first logic signal CA1 which is 0 because of no input at the negative end of the first comparator 151, and outputs the output clock signal CK2 which is 0 (step S270).

However, when the initial oscillator signal CK1 is greater than the lower threshold value $V_{TH1}$, the second logic signal CA2 becomes 0 (step S263). The first NOR gate 153 receives the second logic signal CA2 and the first logic signal CA1 which is 0 because of no input at the negative end of the first comparator 151, and outputs the output clock signal CK2 which becomes 1 (step S270).

Through the above steps S220 to S270, the output clock signal CK2 is toggling. Besides, during the output clock signal CK2 is toggling, the threshold value generation circuit 140 performs the calibration procedure of the threshold values, so that the clock output circuit 150 utilizes each of the threshold values transmitted from the threshold value generation circuit 140, to update the output clock signal CK2. When the output clock signal CK2 has been toggled (step S280) at the desired duty cycle, it is not necessary to perform the calibration procedure to adjust the threshold values, and the apparatus 10 may directly utilize the calibrated threshold values to toggle the output clock signal through the steps S220 to S270. The detail calibration procedure is disclosed in FIG. 4.

Figure 4:
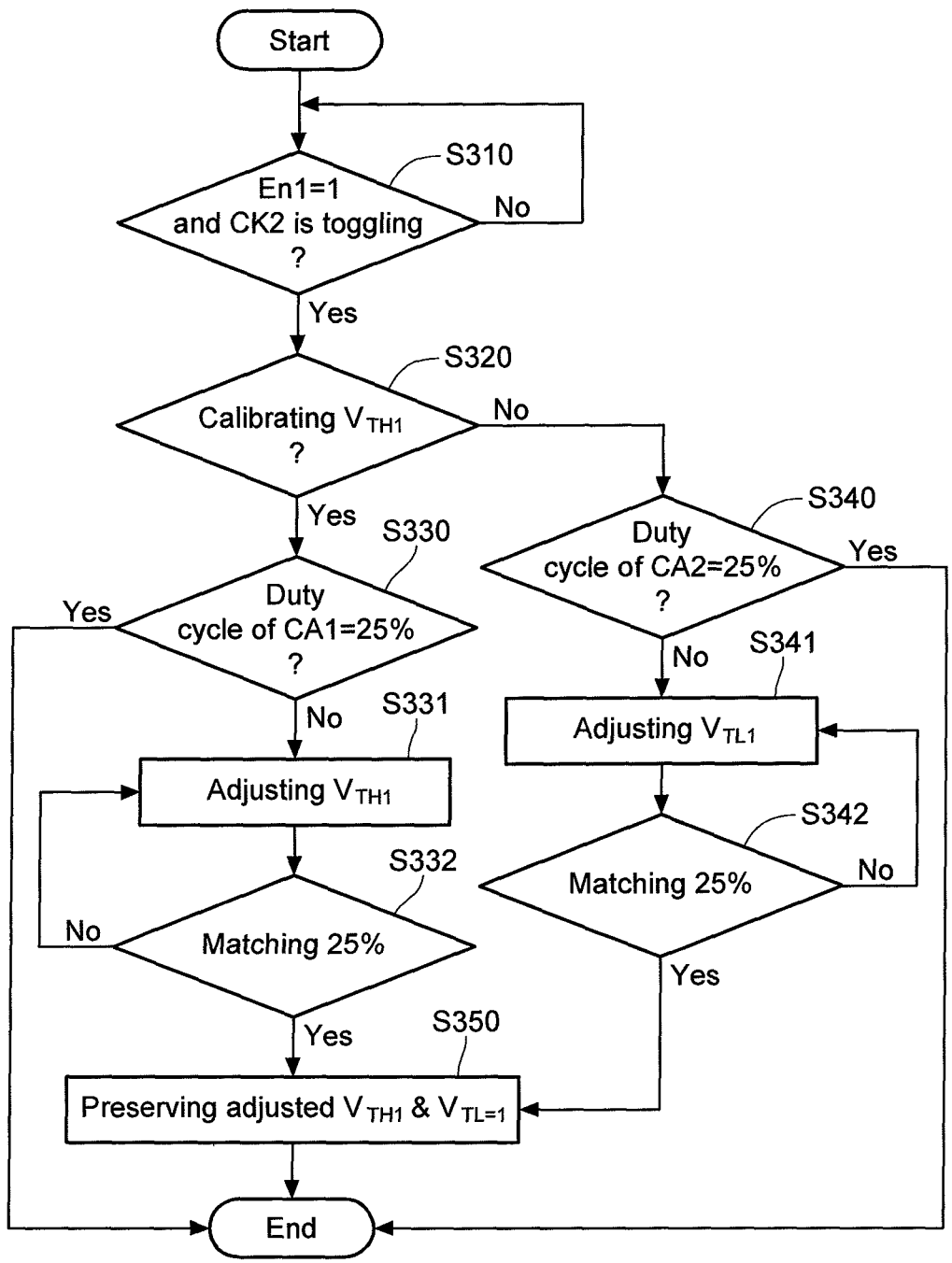
FIG. 4 is a flow chart of one embodiment of a calibration procedure of the implementation of FIG. 3.

Referring to FIG. 4, it illustrates a flow chart of a method of calibrating threshold values of the implementation of FIG. 3 for the target duty cycle and pulse width. The enable signal En1 and output clock signal CK2 are determined (step S310). When the enable signal En1 is 0 and the output clock signal CK2 does not start toggle, the process maintains at the step S310. When the enable signal En1 becomes 1 and the output clock signal CK2 is starting toggle, the calibration unit 141 determines whether to perform the calibration of the upper threshold value $V_{TH1}$ firstly (step S320). When the calibration of the upper threshold value $V_{TH1}$ is performed, the duty cycle of the first logic signal CA1 is determined based on a predefined value (step S330).

In an embodiment, the predefined value may be but not limited to 25 percent. When the duty cycle of the first logic signal CA1 matches 25 percent, the calibration unit 141 does nothing to the upper threshold value $V_{TH1}$. When the duty cycle of the first logic signal CA1 is different from 25 percent, the calibration unit 141 adjusts (increases or reduces) the upper threshold value $V_{TH1}$ (step S331) until the duty cycle of the first logic signal CA1 is equal to 25 percent (step S332). The adjusted upper threshold value $V_{TH1}$ is preserved in the threshold register unit 142 (step S350).

On the other hand, when the calibration of the lower threshold value $V_{TH1}$ is performed, the duty cycle of the second logic signal CA2 is determined based on the predefined value (step S340). When the duty cycle of the second logic signal CA2 is equal to 25 percent, the calibration unit 141 does nothing to the lower threshold value $V_{TL1}$. When the duty cycle of the second logic signal CA2 is different from 25 percent, the calibration unit 141 adjusts the lower threshold value $V_{TL1}$ (step S341) until the duty cycle of the second logic signal CA2 is equal to 25 percent (step S342). The adjusted lower threshold value $V_{TL1}$ is preserved in the threshold register unit 142 (step S350).

In one embodiment, the calibrations of the lower and upper threshold values $V_{TL1}$ and $V_{TH1}$ may be performed simultaneously.

Figure 6:
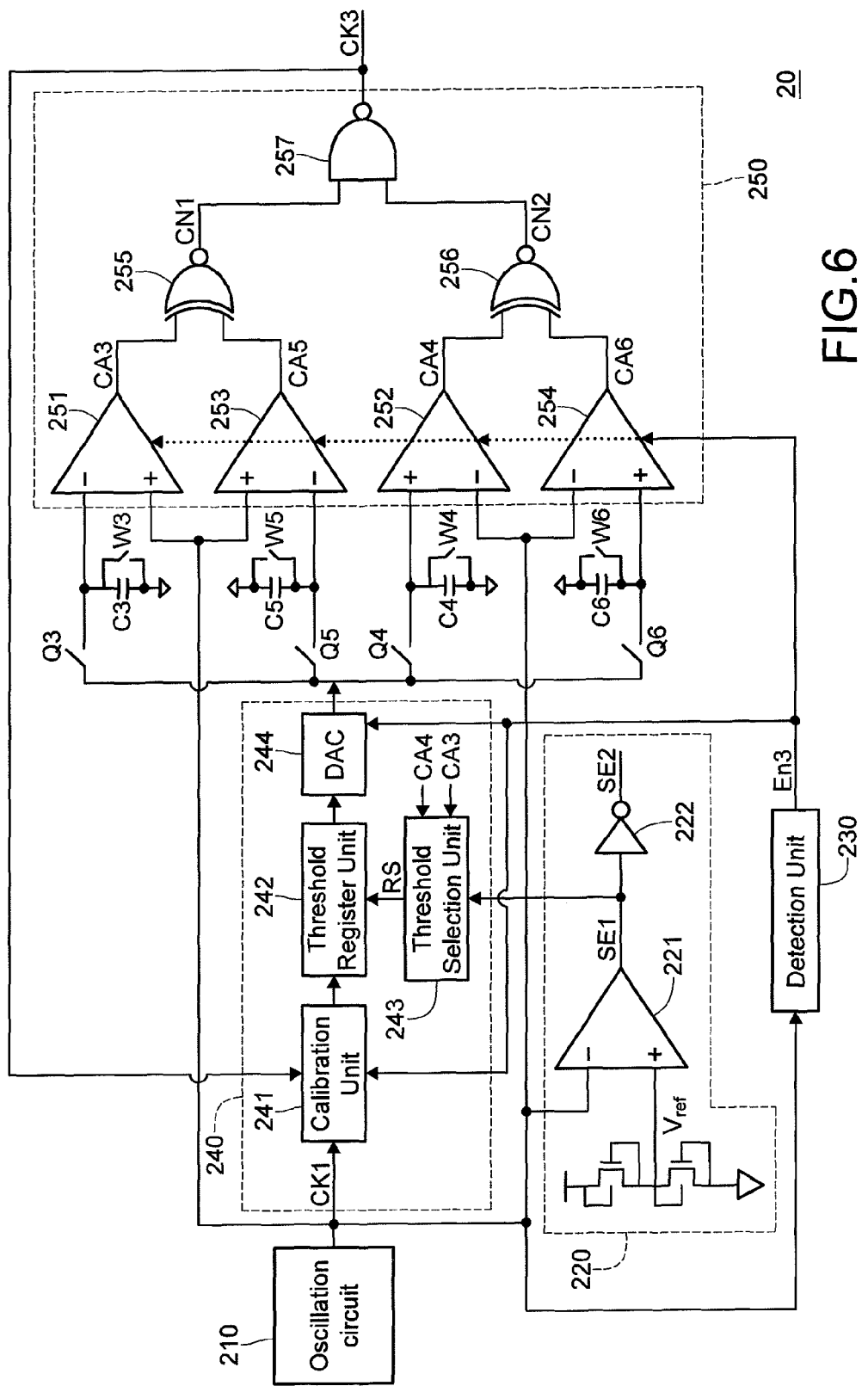
FIG. 6 is a block diagram of an apparatus for quadrupling the frequency of a clock in the implementation of FIG. 1.

FIG. 6 illustrates a block diagram of an apparatus for quadrupling the frequency of a clock in the implementation of FIG. 1A or 1B. The apparatus 20 includes an oscillation circuit 210, a control signal generation circuit 220, a detection unit 230, a threshold value generation circuit 240 and a clock output circuit 250. The oscillation circuit 210, the control signal generation circuit 220 and the detection unit 230 are similar to the corresponding elements in FIG. 2. The detailed structures of the other elements of the apparatus 20 are disclosed as below.

The threshold value generation circuit 240 includes a calibration unit 241, a threshold register unit 242, a threshold selection unit 243 and a digital to analog converter 244. The threshold register unit 242 and the digital to analog converter 244 are similar to the threshold register unit 142 and the digital to analog converter 143 of FIG. 2 respectively.

Figures 7A, 7B, 7C:
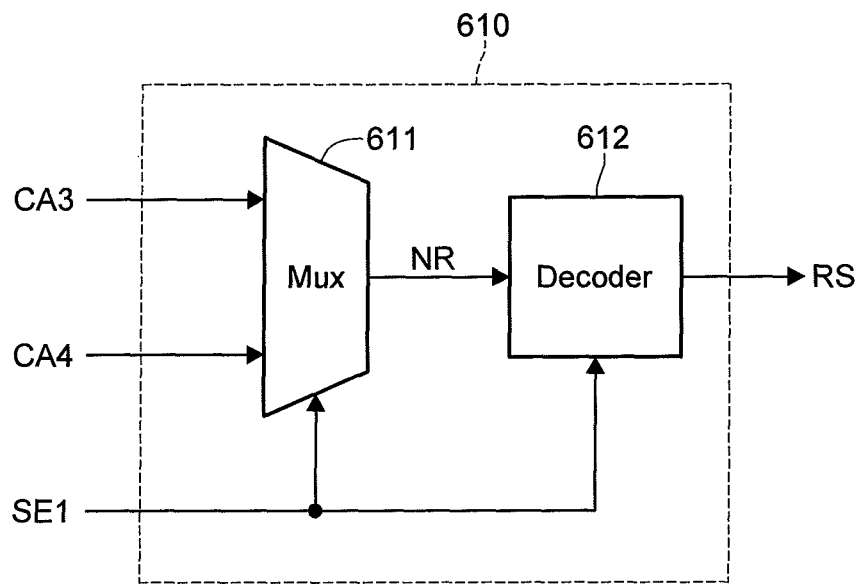
FIGS. 7A and 8A are two block diagrams of a threshold selection unit in implementation of FIG. 6.
FIGS. 7B and 7C are two truth tables of a threshold selection unit in implementation of FIG. 7A.

The calibration unit 241 connects to the threshold register unit 242, the oscillation circuit 210 and the detection circuit 230 and calibrates threshold values including a first upper threshold value, a first lower threshold value, a second upper threshold values and a second lower threshold value. All calibrated threshold values are further preserved in the threshold register unit 242, and each of the preserved threshold values is asynchronously selected according to a selection signal RS and transmitted to the digital to analog converter 244. The threshold selection unit 243 connects to the threshold register unit 242 and the clock output circuit 250 and provides the selection signal RS to the threshold register unit 242. The selection signal RS is generated according to a first logic signal CA4 and/or a second logic signal CA3 and the first control signal SE1 all of which can be implemented according to FIGS. 7B and 7C or FIG. 8B. As shown in FIG. 7A, in one embodiment based on the FIGS. 7B and 7C, the threshold selection unit 610 includes a multiplexer 611 and a decoder 612. The multiplexer 611 connects to the comparator 221 and the clock output circuit 250 and selects one of the first and second logic signals CA3 and CA4 as a third control signal NR in response to the first control signal SE1. The decoder 612 decodes the third control signal NR according to the first control signal SE1 and then outputs the selection signal RS.

Figures 8A, 8B:
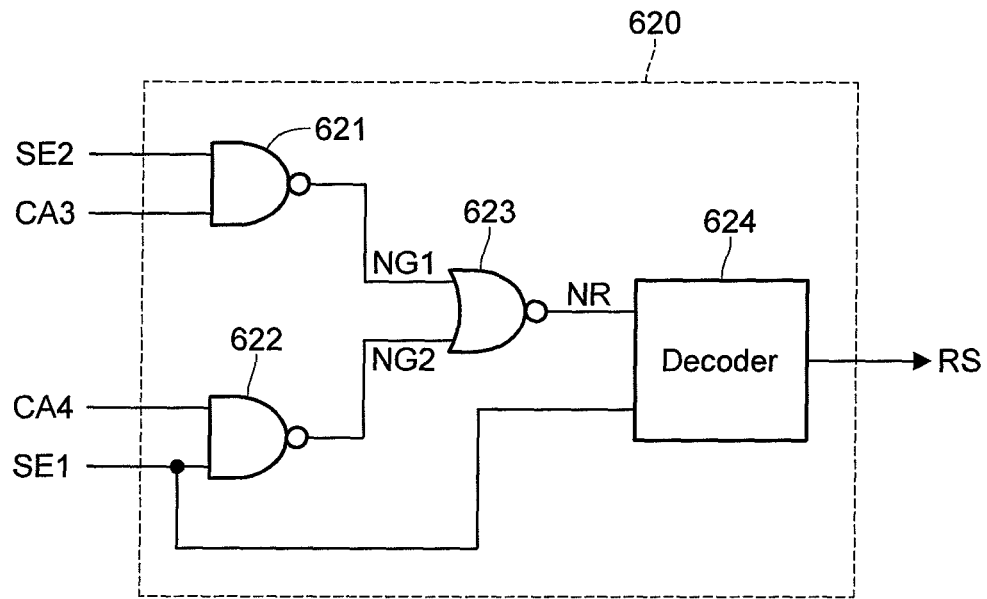
FIG. 8B is a truth table of a threshold selection unit in implementation of FIG. 8A.

As shown in FIG. 8A, in other embodiment based on FIG. 8B, the threshold selection unit 620 includes a second NAND gate 621, a third NAND gate 622, a second NOR gate 623 and a decoder 624. The second NAND gate 621 processes the second control signal SE2 and the first logic signal CA3 and then outputs a first NAND signal NG1. The second NAND gate 622 processes the first control signal SE1 and the second logic signal CA4 and then outputs a second NAND signal NG2. The second NOR gate 623 processes the first and second logic signals NG1 and NG2 and then outputs a third control signal NR. The decoder 624 decodes the third control signal NR and the first control signal SE1 and then outputs output the selection signal RS.

As shown in FIG. 6, the clock output circuit 250 connects to the threshold value generation circuit 240 through a first S/H circuit, a second S/H circuit, a third S/H circuit and a fourth S/H circuit and includes a first comparator 251, a second comparator 252, a third comparator 253, a fourth comparator 254, and a digital and logical module which includes, but not limit to, a first XNOR gate 255, a second XNOR gate 256 and a first NAND gate 257. Each of all the comparators asynchronously compares the initial oscillator signal with one of the first and second upper and lower threshold values to generate a corresponding logic signal.

A positive end of the first comparator 251 connects to the oscillation circuit 210 to receive the initial oscillator signal CK1, and a negative end of the first comparator 251 receives the first lower threshold value from the digital to analog converter 244 through a first S/H provided by the first S/H circuit. The first comparator 251 compares the initial oscillator signal CK1 with the first upper threshold value to output a first logic signal CA3 through an output end of the first comparator 251.

A negative end of the second comparator 252 connects to the oscillation circuit 210 to receive the initial oscillator signal CK1, and a positive end of the second comparator 252 receives the first upper threshold value from the digital to analog converter 244 through a second S/H provided by the second S/H circuit. The second comparator 252 compares the initial oscillator signal CK1 with the first lower threshold value to output a second logic signal CA4 through an output end of the second comparator 252.

A positive end of the third comparator 253 connects to the oscillation circuit 210 to receive the initial oscillator signal CK1, and a negative end of the third comparator 253 receives the second upper threshold value from the digital to analog converter 244 through a third S/H provided by the third S/H circuit. The third comparator 253 compares the initial oscillator signal CK1 with the second upper threshold value to output a third logic signal CA5 through an output end of the third comparator 253.

A negative end of the fourth comparator 254 connects to the oscillation circuit 210 to receive the initial oscillator signal CK1, and a positive end of the fourth comparator 254 receives the second lower threshold value from the digital to analog converter 244 through a fourth S/H provided by the fourth S/H circuit. The fourth comparator 254 compares the initial oscillator signal CK1 with the second lower threshold value to output a logic signal CA6 through an output end of the fourth comparator 254.

The first XNOR gate 255 processes the first and third logic signals CA3 and CA5 to output a first sub logic signal CN1. The second XNOR gate 256 processes the second and fourth logic signals CA4 and CA6 to output a second sub logic signal CN2. The first NAND gate 257 processes the first and second sub logic signals CN1 and CN2 to output the output clock signal CK3 which will be the multiplication of the initial oscillator signal.

Each of the S/H circuits in this embodiment includes a charge switch (shown as one of the switches Q3 to Q6), a charge capacitor (shown as one of the capacitors C3 to C6) and a reset switch (shown as one of the switches W3 to W6). Each switch is disposed between the digital to analog converter 244 and the negative or positive end of corresponding one of the comparators in the clock output circuit 250 and is controlled by a corresponding switch signal. The charge capacitor and reset switch in one set are disposed between the negative or positive end of the corresponding one of the comparators and a ground, and the reset switch is controlled by a reset signal provided by the apparatus 20.

When the reset signal is high, the switches W3, W4, W5 and W6 are simultaneously closed and the energy separately stored in the capacitors C3, C4, C5 and C6 is released to the ground. Moreover, a first switch signal used to control the switch Q3 is generated by processing the second control signal SE2 and the third control signal NR through an AND gate. The second switch signal used to control the switch Q4 is generated by processing the control signal SE1 and the third control signal NR through an AND gate. The third switch signal used to control the switch Q5 is generated directly by the logic signal CA3. The forth switch signal used to control the switch Q6 is generated directly by the logic signal CA4.

Figure 9:
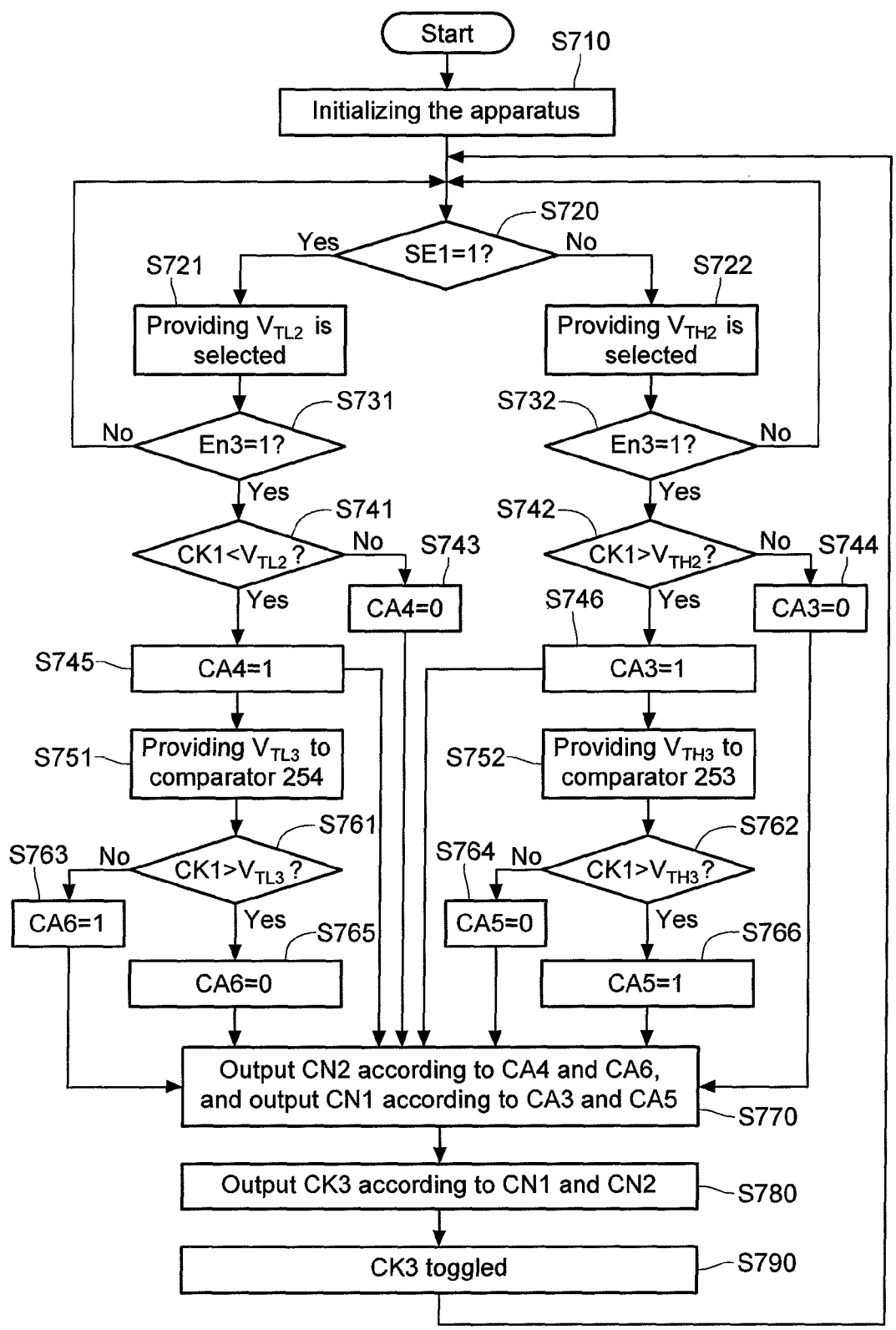
FIG. 9 is a flow chart of a method of quadrupling the frequency of a clock signal in the implementation of FIG. 6.
Figure 11:
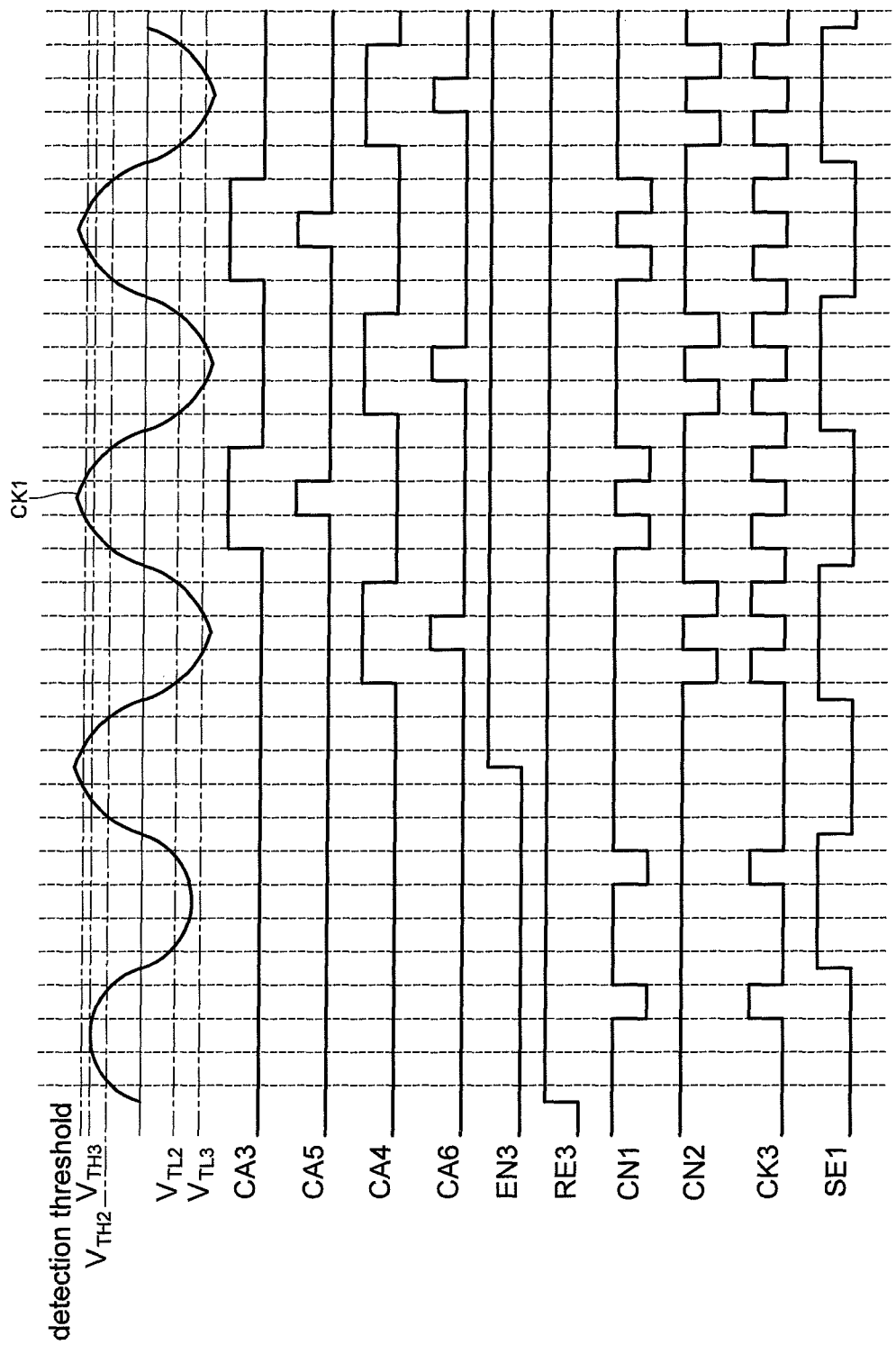
FIG. 11 is a sequence diagram of the implementation of FIG. 6.

As shown in FIGS. 9 and 11, the apparatus 20 is initialized when the apparatus 20 starts operating (step S710). The apparatus 20 provides a reset signal RE to turn on the switches W3, W4, W5 and W6 to reset the capacitors C1, C2, C3 and C4.

Subsequently, the initial oscillator signal CK1 is determined based on the reference signal Vref in the control comparator 221 (step S720). When the initial oscillator signal CK1 is less than the reference signal Vref, the first control signal SE1 is 1, where the first lower threshold value $V_{TL2}$ is selected (step S721). If not, the first control signal SE1 is 0, where the first upper threshold value $V_{TH2}$ is selected (step S722).

After the first $V_{TL2}$ is selected, the operation of the oscillation circuit 210 is determined by the detection unit 230 (step 731). If the oscillation circuit 210 is not ready, the process is back to the step S720, but if yes, the enable signal En3 becomes 1 so as to enable all the S/H circuits, all the comparators of the clock output circuit 250, the calibration unit 241 and the digital to analog converter 244. The threshold value generation circuit 240 transmits the first lower threshold value $V_{TL2}$ to the second comparator 252 through the second S/H. The second comparator 252 compares the initial oscillator signal CK1 with the first lower threshold value $V_{TL2}$ (step S741) to output the second logic signal CA4.

When the initial oscillator signal CK1 is greater than the first lower threshold value $V_{TL2}$, the second logic signal CA4 is 0 (step S743). The second XNOR gate 256 processes the second logic signal CA4 and the fourth logic signal CA6 which is 0 to output the second sub logic signal CN2 which is 0 (step S770). Herein, the first XNOR gate 255 processes the first and third logic signals CA3 and CA5 both of which are 0, and then outputs the first sub logic signal CN1 which is 1 (step S770). The first NAND gate 257 processes the first and second sub logic signals CN1 and CN2 to output the output clock signal CK3 which is 1 (step S780).

When the initial oscillator signal CK1 is less than the first lower threshold value $V_{TL2}$, the logic signal CA4 is 1 (step S745). The second XNOR gate 256 processes the second logic signal CA4 and the fourth logic signal CA6 which is still 0, and then outputs the second sub logic signal CN2 which becomes 1 (step S770). The first XNOR gate 255 processes the first logic signal CA3 and the third logic signal CA5 both of which are 0 because of no input at both the negative end of the first comparator 251 and positive end of the third comparator 253, and then outputs the first sub logic signal CN1 which is still 1 (step S770). The first NAND gate 257 processes the first and second sub logic signals CN1 and CN2 to output the output clock signal CK3 which becomes 0 (step S780).

On the other hand, the second lower threshold value $V_{TL3}$ is selected according to the selection signal RS and is transmitted to the fourth comparator 254 through the fourth S/H controlled by the second logic signal CA4 which is 1 (step S751). The initial oscillator signal CK1 is determined based on the second lower threshold value $V_{TL3}$ (step S761).

When the initial oscillator signal CK1 is still greater than the second lower threshold value $V_{TL3}$, the fourth logic signal CA6 is 0 (step S765). The second XNOR gate 256 processes the fourth logic signal CA6 and the second logic signal CA4 which is 1 to output the second sub logic signal CN2 which is 0 (step S770). The first and third logic signals CA3 and CA5 herein are 0, and the first sub logic signal CN1 is 1 (step S770). The first NAND gate 257 processes the first and second sub logic signals CN1 and CN2 to output the output clock signal which is 1 (step S780).

When the initial oscillator signal CK1 is less than the second lower threshold value $V_{TL3}$, the fourth logic signal CA6 is 1 (step S763). Since the second logic signal CA4 is 1 and the first and third logic signals CA3 and CA5 herein are also 0, the first and second sub logic signals CN1 and CN2 are 1 (step S770). Thus, the output clock signal CK3 becomes 0 (step S780).

On the other hand, after the first upper threshold value $V_{TH2}$ is selected (step S722), the first upper threshold value $V_{TH2}$ is transmitted to the first comparator 251 when the enable signal En3 is 1 (step S732). The initial oscillator signal CK1 is determined based on the first upper threshold value $V_{TH2}$ in the first comparator 251 (step S742).

When the initial oscillator signal CK1 is less than the first upper threshold value $V_{TH2}$, the first comparator 251 outputs the first logic signal CA3 which is 0 (step S744). The second, third and fourth logic signals CA4, CA5 and CA6 herein are 0. The first XNOR gate 255 processes the first and third logic signals CA3 and CA5 to output the first sub logic signal CN1 which is 1 (step S770). The second XNOR gate 256 processes the second and fourth logic signals CA4 and CA6 to output the second sub logic signal CN2 which is 1 (step S770). The first NAND gate 257 processes the first and second sub logic signals CN1 and CN2 to output the output clock signal CK3 which is 0 (step S780).

When the initial oscillator signal CK1 is greater than the first upper threshold value $V_{TH2}$ (step S732), the first logic signal CA3 becomes 1 (step S746). The second and fourth logic signals CA4 and CA6 herein are 0, and the third logic signal CA5 herein is 1. The first XNOR gate 255 processes the first and third logic signals CA3 and CA5 to output the first sub logic signal CN1 which is 1 (step S770). The second XNOR gate 256 processes the second and fourth logic signals CA4 and CA6 to output the second sub logic signal CN2 which is 1 (step S770). The first NAND gate 257 processes the first and second sub logic signals CN1 and CN2 to output this output clock signal CK3 which is 0 (step S780).

Moreover, The second upper threshold value $V_{TH3}$ is selected and transmitted to the third comparator 253 through the third S/H controlled by the first logic signal CA3 which is 1 (step S752). The initial oscillator signal CK1 is determined based on the second upper threshold value $V_{TH3}$ (step S762).

When the initial oscillator signal CK1 is less than the second upper threshold value $V_{TH3}$, the third logic signal CA5 is 0 (step S764). The first logic signal CA3 maintains at 1 herein. The second and fourth logic signals CA4 and CA6 still maintain at 0 herein. Then, the first XNOR gate 255 processes the first and third logic signals CA3 and CA5 to output the first sub logic signal CN1 which is 0, and the second XNOR gate 256 processes the second and fourth logic signals CA4 and CA6 to output the second sub logic signal CN2 which is 1 (step S770). The first NAND gate 257 processes the first and second sub logic signals CN1 and CN2 to output the output clock signal CK3 which becomes 1 (step S780).

When the initial oscillator signal CK1 is greater than the second upper threshold value $V_{TH3}$, the third logic signal CA5 becomes 1 (step S766). The first logic signal CA3 still maintains at 1. The second and fourth logic signals CA4 and CA6 still maintain at 0. The first sub logic signal CN1 herein is 1, and the second sub logic signal CN2 herein is 1 (step S770). The output clock signal CK3 becomes 0 (step S780).

In the disclosure, the order for selecting current one of the threshold values is based on the comparison of the initial oscillator signal CK1 and a previous threshold value and based on the comparison of the current initial oscillator signal CK1 and the reference signal Vref.

Through the above steps S720 to S780, the output clock signal CK3 is toggling. Besides, during the output clock signal CK3 is toggling, the threshold value generation circuit 240 performs the calibration procedure of the threshold values to adjust the threshold values, so that the clock output circuit 250 utilizes each of the threshold values transmitted from the threshold value generation circuit 240, to update the output clock signal CK3. When the output clock signal CK3 has been toggled (step S790) at the desired duty cycle, it is not necessary to perform the calibration procedure to adjust the threshold values, and the apparatus 20 may directly utilize the calibrated threshold values to update the output clock signal through the steps S720 to S780. The detail calibration procedure is disclosed in FIG. 10.

Figure 10:
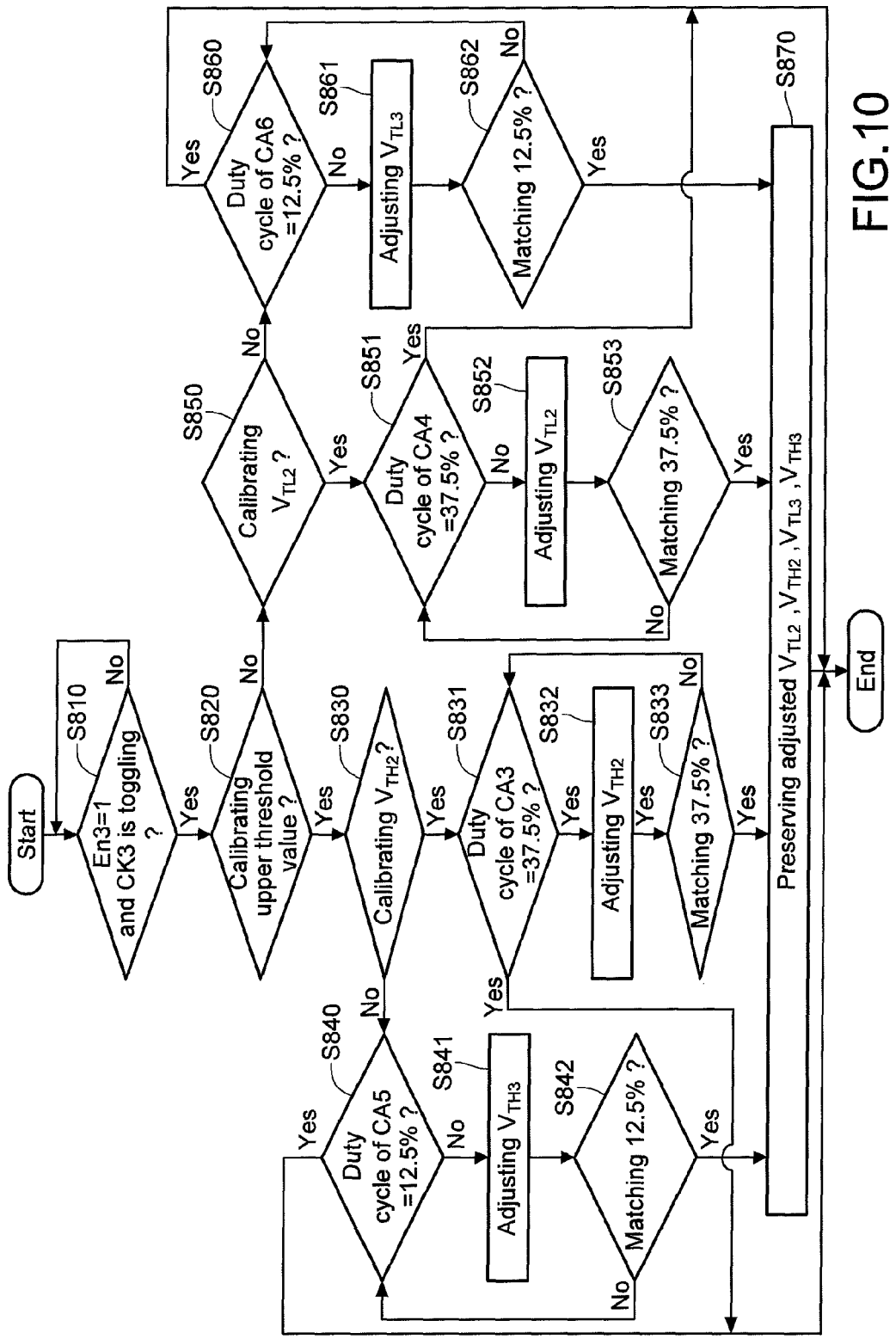
FIG. 10 is a flow chart of one embodiment of a calibration procedure of the implementation of FIG. 6.

Referring to FIG. 10, in one embodiment, the initial oscillator signal CK1 is a full swing sinusoidal signal and the target duty cycle of the clock output signal CK3 is 50 percent. The voltages Vdd of initial threshold values for calibration are set as following:

$$V_{TH3}=Vdd/2 \times \sin(0.375\ \text{pi})+Vdd/2; V_{TH2}=Vdd/2 \times \sin(0.125\ \text{pi})+Vdd/2;\ \text{and}$$

$$V_{TL3}=Vdd/2 \times \sin(1.375\ \text{pi})+Vdd/2; V_{TL2}=Vdd/2 \times \sin(1.125\ \text{pi})+Vdd/2.$$

Firstly, the enable signal En3 and the output clock signal CK3 are determined (step S810). When the enable signal En3 is 0 and when the output clock signal CK3 does not start toggling, the process stays at step S810. When the enable signal En3 becomes 1 and when the output clock signal CK3 starts toggling, the calibration unit 241 determines whether to perform the calibration of the upper threshold values (step S820).

When the calibration of the upper threshold values is performed, the threshold value generation circuit 240 further determines whether to perform the calibration of the first upper threshold value $V_{TH2}$ (step S830). When the calibration of the first upper threshold value $V_{TH2}$ is performed, the duty cycle of the first logic signal CA3 is determined based on a first predefined value (step S831).

In an embodiment, if the output duty cycle of 50 percent is desired, the first predefined value may be but not limit to 37.5 percent. When the duty cycle of the logic signal CA3 is equal to 37.5 percent, the calibration unit 241 does nothing to the initial first upper threshold value $V_{TH2}$. When the duty cycle of the logic signal CA4 is different from 37.5 percent, the calibration unit 241 adjusts (increases or reduces) the initial first upper threshold value $V_{TH2}$ (step S832) until the duty cycle of the first logic signal CA3 is equal to 37.5 percent (step S833). Then, the adjusted first upper threshold value $V_{TH2}$ is stored in the threshold register unit 242 (step S870).

In step S830, when the calibration of the second upper threshold value $V_{TH3}$ is performed, the duty cycle of the third logic signal CA5 is determined based on a second predefined value (step S840).

In an embodiment, if the output duty cycle of 50 percent is desired, the second predefined value may be but not limit to 12.5 percent. When the duty cycle of the third logic signal CA5 is equal to 12.5 percent, the calibration unit 241 does nothing to the second upper threshold value $V_{TH3}$. When the duty cycle of the third logic signal CA5 is different from 12.5 percent, the calibration unit 241 adjusts the second upper threshold value $V_{TH3}$ (step S841) until the duty cycle of the third logic signal CA5 is equal to 12.5 percent (step S842). Then, the adjusted second upper threshold value $V_{TH3}$ is stored in the threshold register unit 242 (step S870).

When the calibration of the first lower threshold value $V_{TL2}$ is performed, the duty cycle of the second logic signal CA4 is determined based on the first predefined value (step S851). When the duty cycle of the second logic signal CA4 is equal to 37.5 percent, the calibration unit 241 does nothing to the first lower threshold value $V_{TL2}$. When the duty cycle of the second logic signal CA4 is different from 37.5 percent, the calibration unit 241 adjusts (increases or reduces) the first lower threshold value $V_{TL2}$ (step S852) until the duty cycle of the second logic signal CA4 is equal to 37.5 percent (step S853). Then, the adjusted first lower threshold value $V_{TL2}$ is stored in the threshold register unit 242 (step S870).

When the calibration of the second lower threshold value $V_{TL3}$ is performed, the duty cycle of the fourth logic signal CA6 is determined based on the second predefined value (step S860). When the duty cycle of the second logic signal CA4 is equal to 12.5 percent, the calibration unit 241 does nothing to the second lower threshold value $V_{TL3}$. When the duty cycle of the fourth logic signal CA6 is different from 12.5 percent, the calibration unit 241 adjusts the second lower threshold value $V_{TL3}$ (step S861) until the duty cycle of the fourth logic signal CA6 is equal to 12.5 percent (step S862). Then, the adjusted second lower threshold value $V_{TL3}$ is stored in the threshold register unit 242 (step S870).

The disclosure may be embodied in other specific forms without departing from its spirit or essential characteristics. The described embodiments are to be considered in all respects only as illustrative and not restrictive. The scope of the invention is, therefore, indicated by the appended claims rather than by the foregoing description. All changes which come within the meaning and range of equivalency of the claims are to be embraced within their scope.

What is claimed is:

1. A method for multiplying frequency of a clock signal, comprising:
    providing an initial oscillator signal;
    via a control signal generation circuit, comparing the initial oscillator signal with a reference signal to generate a first control signal and output the first control signal to a threshold value generation circuit;
    via the threshold value generation circuit, selecting one of at least one lower threshold value and at least one upper threshold value according to at least the first control signal, and outputting the selected one of the at least one upper and lower threshold values to a digital and logical module; and
    via the digital and logical module, processing a comparison between the initial oscillator signal and the selected one of the at least one upper and lower threshold values and a comparison between the initial oscillator signal and a low level signal, so as to output an output clock signal, wherein the step of outputting the output clock signal comprises:
    generating a plurality of logic signals by a plurality of comparators comparing the initial oscillator signal with the selected one of the at least one upper and lower threshold values and comparing the initial oscillator signal with the low level signal; and
    processing the logic signals by the digital and logical module to output the output clock signal;
    wherein while one of the logic signals is updated by the comparison of the initial oscillator signal and the selected one of the at least one upper and lower threshold values, at least other one of the logic signals is updated by the comparison between the initial oscillator signal and the low level signal.

2. The method for multiplying frequency of a clock signal according to claim 1, further comprising: calibrating the at least one lower threshold value and the at least one upper threshold value by the threshold value generation circuit, comprising: detecting duty cycles or pulse width of the logic signals; and adjusting the at least one upper threshold value and/or the at least one lower threshold value if a duty cycle of at least one of the logic signals is different from a corresponding predefined duty cycle; and transforming the selected one of the at least one upper and lower threshold values from digital type to analog type and outputting the transformed one of the at least one upper and lower threshold values.

3. The method for multiplying frequency of a clock signal according to claim 2, wherein the step of generating the logic signals comprises:
    updating a first logic signal of the logic signals by comparing the initial oscillator signal with the upper threshold value or with the low level signal; and
    updating a second logic signal of the logic signals by comparing the initial oscillator signal with the lower threshold value or with the low level signal;
    wherein while one of the first and second logic signals is updated by comparing the initial oscillator signal with the corresponding one of the upper and lower threshold values, other one of the first and second logic signals is updated by comparing the initial oscillator signal with the low level signal.

4. The method for multiplying frequency according to claim 2, wherein the at least one lower threshold value comprises a first and a second lower threshold values, the at least one upper threshold value comprises a first and a second upper threshold values, and the step of generating the logic signals comprises:
    updating a first logic signal of the logic signals by comparing the initial oscillator signal with the first upper threshold value or with the low level signal;
    updating a second logic signal of the logic signals by comparing the initial oscillator signal with the first lower threshold value or with the low level signal;
    updating a third logic signal of the logic signals by comparing the initial oscillator signal with the second upper threshold value or with the low level signal; and updating a fourth logic signal of the logic signals by comparing the initial oscillator signal with the second lower threshold value or with the low level signal;

wherein while one of the logic signals is updated by comparing the initial oscillator signal with the corresponding one of the first and second upper and lower threshold values, other ones of the logic signals are respectively updated by comparing the initial oscillator signal with the low level signal.

5. The method for multiplying frequency of a clock signal according to claim 4, wherein the step of outputting the output clock signal further comprises:

processing the first and third logic signals through a first XNOR gate to output a first sub logic signal;

processing the second and fourth logic signals through a second XNOR gate to output a second sub logic signal; and processing the first and second sub logic signals through a first NAND gate to output the output clock signal.

6. The method for multiplying frequency of a clock signal according to claim 4, wherein the step of selecting the one of the at least one upper and lower threshold values comprises:

processing a second control signal and the first logic signal to output a first NAND signal through a second NAND gate, wherein the second control signal is generated by inverting the first control signal;

processing the first control signal and the second logic signal through a third NAND gate to output a second NAND signal;

processing the first and second NAND signals through a second NOR gate to output a third control signal; and decoding the third control signal according to the first control signal to output a selection signal through which the one of the first and second upper and lower threshold values is selected.

7. The method for multiplying frequency of a clock signal according to claim 4, wherein the step of selecting the one of the at least one upper and lower threshold values comprises:

selecting one of the first and second logic signals as a third control signal according to the first control signal; and decoding the third control signal according to the first control signal to output a selection signal through which the one of the first and second upper and lower threshold values is selected.

8. The method for multiplying frequency of a clock signal according to claim 2, further comprising: preserving the at least one upper and lower threshold values.

9. An apparatus for multiplying frequency of a clock signal, comprising:

an oscillation circuit, for generating an initial oscillator signal;

a control signal generation circuit, electronically connected to the oscillation circuit, for comparing the initial oscillator signal with a reference signal to generate a first control signal;

a threshold value generation circuit, electronically connected to the oscillation circuit and the control signal generation circuit, for receiving the first control signal and outputting each of at least one upper threshold value and at least one lower threshold value by turns according to at least the first control signal; and a clock output circuit, electronically connected to the oscillation circuit, the control signal generation circuit and the threshold value generation circuit and comprising a digital and logical module, wherein the digital and logical module processes a comparison between the initial oscillator signal and the outputted one of the at least one upper and lower threshold values and a comparison between the initial oscillator signal and a low level signal to update an output clock signal, wherein the threshold value generation circuit comprises:

a calibration unit, electronically connected to the oscillation circuit and the clock output circuit, for selectively adjusting the at least one upper threshold value and the at least one lower threshold value; and a digital to analog converter, for selectively converting the one of the at least one upper and lower threshold values from digital type to analog type and outputting the converted one of the at least one upper and lower threshold values to the clock output circuit.

10. The apparatus for multiplying frequency of a clock signal according to claim 9, wherein the clock output circuit further comprises:

a plurality of comparators, electronically connected to the digital to analog converter and the oscillation circuit, for comparing the initial oscillator signal with the outputted one of the at least one upper and lower threshold values and with at least one low level signal to generate a plurality of logic signals.

11. The apparatus for multiplying frequency of a clock signal according to claim 10, further comprising:

a plurality of S/H circuits, connected to the digital to analog converter and the comparators, for asynchronously providing a path through which the digital to analog converter transmits the outputted one of the at least one upper and lower threshold values to corresponding one of the comparators.

12. The apparatus for multiplying frequency of a clock signal according to claim 11, wherein the control signal generation circuit comprising:

a control comparator, connected to the oscillation circuit, for comparing the initial oscillator signal with the reference signal to output the first control signal; and an inverter, connected to the control comparator, for inverting the first control signal to output a second control signal.

13. The apparatus for multiplying frequency of a clock signal according to claim 12, wherein the threshold value generation circuit further comprises:

a storage means, connected to the calibration unit and the digital to analog converter, for preserving the upper threshold value and the lower threshold value and selectively outputting one of the preserved upper and lower threshold values to the corresponding one comparator according to the first control signal.

14. The apparatus for multiplying frequency of a clock signal according to claim 10, wherein the comparators comprise a first comparator and a second comparator, the first comparator compares the initial oscillator signal with the upper threshold value or with the low level signal to generate a first logic signal of the logic signals, the second comparator comprises the initial oscillator signal with the lower threshold value or with the low level signal to generate a second logic signal of the logic signals, and the digital and logical module comprises a NOR gate which processes the first logic signal and the second logic signal to update the output clock signal.

15. The apparatus for multiplying frequency of a clock signal according to claim 10, wherein the at least one upper threshold value comprises a first upper threshold, value and a second upper threshold value, the at least one lower threshold value comprises a first lower threshold value and a second lower threshold value, and the comparators comprise:

a first comparator, for comparing the initial oscillator signal with the first upper threshold value or with the low level signal to generate a first logic signal of the logic signals;

a second comparator, for comparing the initial oscillator signal with the first lower threshold value or with the low level signal to generate a second logic signal of the logic signals;

a third comparator, for comparing the initial oscillator signal with the second upper threshold value or with the low level signal to output a third logic signal of the logic signals; and a fourth comparator, for comparing the initial oscillator signal with the second lower threshold value or with the low level signal to output a fourth logic signal of the logic signals;

wherein while one of the first, second, third and fourth comparators compares the initial oscillator signal with the corresponding one of the first and second lower and upper threshold values, other ones of the first, second, third and fourth comparators respectively compare the initial oscillator signal with the low level signal.

16. The apparatus for multiplying frequency of a clock signal according to claim 15, wherein the digital and logic module comprises:

a first XNOR, connected to the first and third comparators, for receiving the first and third logic signals to output a first sub logic signal;

a second XNOR, connected to the second and fourth comparators, for receiving the second and fourth logic signals to output a second sub logic signal; and a first NAND, connected to the first and second XNORs, for receiving the first sub and second sub logic signals to output the output clock signal.

17. The apparatus for multiplying frequency of a clock signal according to claim 15, wherein the threshold value generation circuit further comprises:

a storage means, electrically connected to the calibration unit and the digital and logical converter, for preserving the first and second upper and lower threshold values and selectively outputting one of the preserved first and second upper and lower threshold values to the digital to analog converter according to a selection signal; and a threshold selection unit, electrically connected to the storage means, the control signal generation circuit and the first and second comparators, for providing the selection signal according to the first and second logic signals and the first control signal.

18. The apparatus for multiplying frequency of a clock signal according to claim 17, wherein the threshold selection unit comprising:

a multiplexer, electrically connected to the first and second comparators and the control signal generation circuit, for selecting one of the first and second logic signals as a third control signal according to the first control signal; and a decoder, electrically connected to the multiplexer and the control signal generation circuit, for decoding the third control signal according to the first control signal to output the selection signal.

19. The apparatus for multiplying frequency of a clock signal according to claim 17, wherein the threshold selection unit comprising:

a second NAND, electrically connected to the control signal generation circuit and the clock output circuit, for receiving an inverse first logic signal and a second control signal to output a first NAND signal, wherein the inverse first logic signal is generated by inverting the first logic signal, and the second control signal is generated by inverting the first control signal;

a third NAND, electrically connected to the control signal generation circuit and the clock output circuit, for receiving the second logic signal and the first control signal to output a second NAND signal;

a NOR, electrically connected to the second and third NANDs, for receiving the first and second NAND signals to output a third control signal; and a decoder, electrically connected to the NOR and the control signal generation circuit, for decoding the third control signal according to the first control signal to output the selection signal.

20. The apparatus for multiplying frequency of a clock signal according to claim 10, wherein the threshold value generation circuit calibrates the at least one lower threshold value and the at least one upper threshold value through a calibration procedure, and the calibration procedure comprises:

detecting duty cycles or pulse width of the logic signals; and adjusting the at least one upper threshold value and/or the at least one lower threshold value if the duty cycle of at least one of the logic signals is different from a corresponding predefined duty cycle.

* * * * *